(12) United States Patent
Davidovits

(10) Patent No.: US 11,000,077 B2
(45) Date of Patent: May 11, 2021

(54) SYSTEM, METHOD, AND APPARATUS FOR PROVIDING COOLING

(71) Applicant: ThermoBionics LLC, Boston, MA (US)

(72) Inventor: Terence Davidovits, Boston, MA (US)

(73) Assignee: Thermobionics LLC, Boston, MA (US)

( * ) Notice: Subject to any disclaimer, the term of this patent is extended or adjusted under 35 U.S.C. 154(b) by 235 days.

(21) Appl. No.: 16/012,329

(22) Filed: Jun. 19, 2018

(65) Prior Publication Data

US 2019/0008219 A1 Jan. 10, 2019

Related U.S. Application Data

(60) Provisional application No. 62/530,772, filed on Jul. 10, 2017.

(51) Int. Cl.
  A41D 13/005 (2006.01)
  F04D 25/08 (2006.01)
  F04D 29/28 (2006.01)
  A41D 13/002 (2006.01)
  F04D 29/70 (2006.01)

(52) U.S. Cl.
  CPC ..... *A41D 13/0053* (2013.01); *A41D 13/0025* (2013.01); *F04D 25/08* (2013.01); *F04D 29/282* (2013.01); *F04D 29/705* (2013.01)

(58) Field of Classification Search
  CPC ............ A41D 13/0053; A41D 13/0025; F04D 29/282; F04D 29/705; F04D 25/08
  See application file for complete search history.

(56) References Cited

U.S. PATENT DOCUMENTS

| | | | |
|---|---|---|---|
| 4,856,294 A | 8/1989 | Scaringe | |
| 5,871,526 A * | 2/1999 | Gibbs | A61F 7/02 165/46 |
| 5,946,931 A | 9/1999 | Lomax | |
| 6,257,011 B1 | 7/2001 | Siman-Tov | |
| 6,510,696 B2 | 1/2003 | Guttman | |
| 6,543,247 B2 | 4/2003 | Strauss | |
| 7,010,936 B2 | 3/2006 | Rini | |
| 7,089,995 B2 * | 8/2006 | Koscheyev | A41D 13/005 165/46 |

(Continued)

FOREIGN PATENT DOCUMENTS

| | | |
|---|---|---|
| CN | 201192092 | 2/2009 |
| CN | 201830979 | 5/2011 |
| WO | 2014108892 | 7/2014 |

OTHER PUBLICATIONS

Zhang et al., Energy, "A review of the recent advances in superhydrophobic surfaces and the emerging energy-related applications" (Feb. 2015).

(Continued)

*Primary Examiner* — Woody A Lee, Jr.
(74) *Attorney, Agent, or Firm* — Ellenoff Grossman & Schole LLP; James M. Smedley; Alex Korona

(57) ABSTRACT

An apparatus is disclosed. The apparatus has a cooling fluid passage, a gaseous fluid blower disposed at an upstream portion or a downstream portion of the cooling fluid passage, and a liquid droplet sprayer disposed at the upstream portion of the cooling fluid passage. A surface portion of the cooling fluid passage is hydrophobic.

17 Claims, 8 Drawing Sheets

(56) References Cited

U.S. PATENT DOCUMENTS

| | | |
|---|---|---|
| 7,124,593 B2 | 10/2006 | Feher |
| 7,204,298 B2 | 4/2007 | Hodes |
| 7,249,464 B1 | 7/2007 | Watson |
| 7,828,524 B2 * | 11/2010 | Chen .................... F04D 25/084 |
| | | 416/63 |
| 7,997,561 B2 | 8/2011 | Goldmann |
| 2002/0987055 | 6/2002 | Appolonia |
| 2006/0180300 A1 | 8/2006 | Lenehan |
| 2007/0240445 A1 | 10/2007 | Morrison |
| 2009/0044932 A1 * | 2/2009 | Blackstone ........ A41D 13/0025 |
| | | 165/158 |
| 2011/0098615 A1 * | 4/2011 | Whalen .................. A61H 9/00 |
| | | 601/151 |

OTHER PUBLICATIONS

Richard et al., Europhysics Letters, "Bouncing water drops" (Jun. 2000).

International Search Report and Written Opinion dated Sep. 12, 2018, in counterpart international application PCT/US2018/041195.

\* cited by examiner

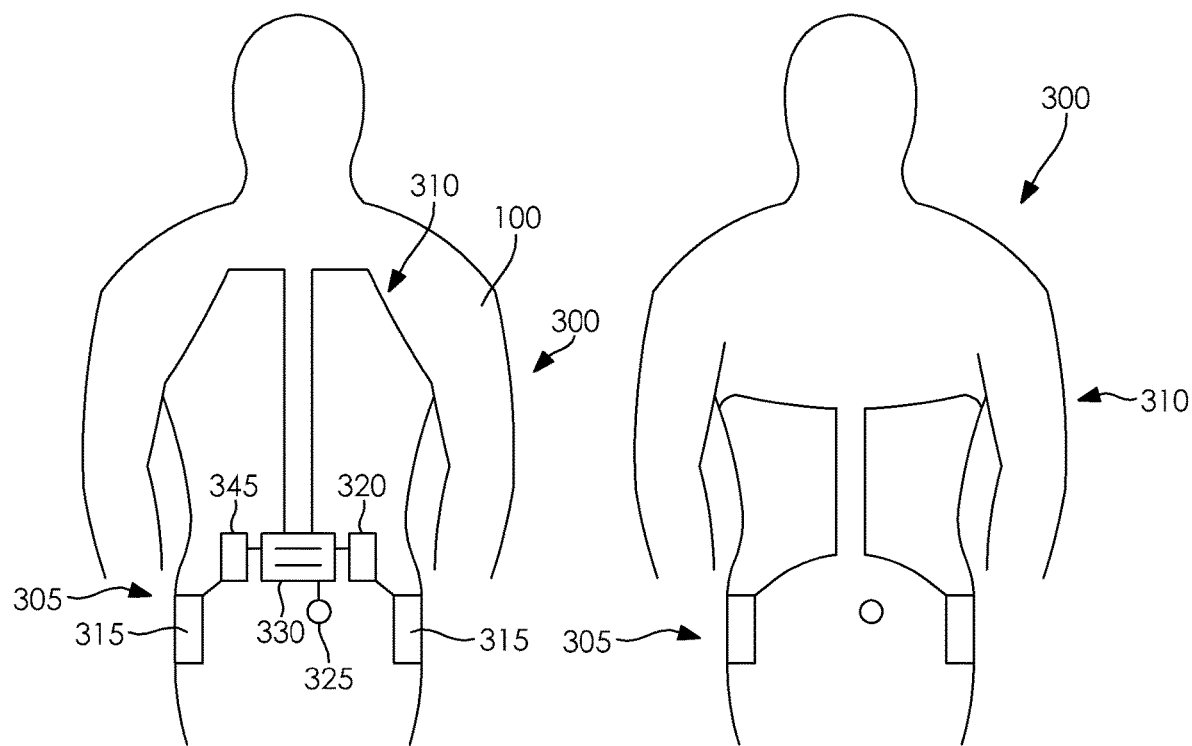
FIG. 1  FIG. 2
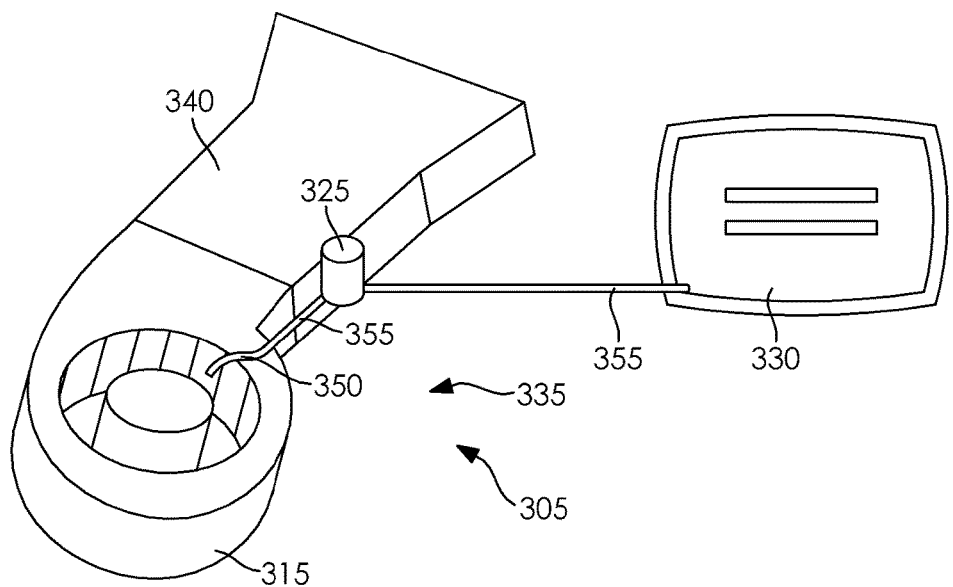
FIG. 3

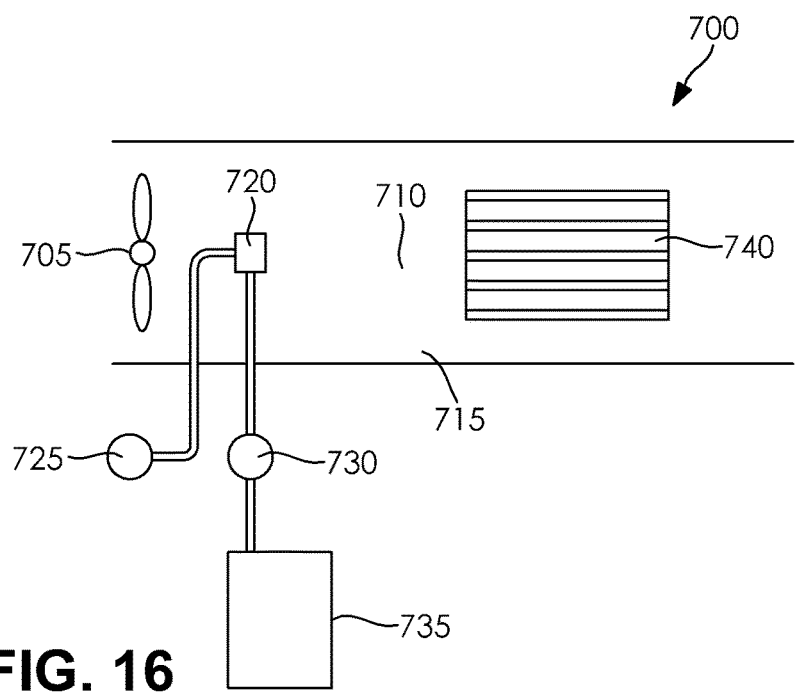
FIG. 16
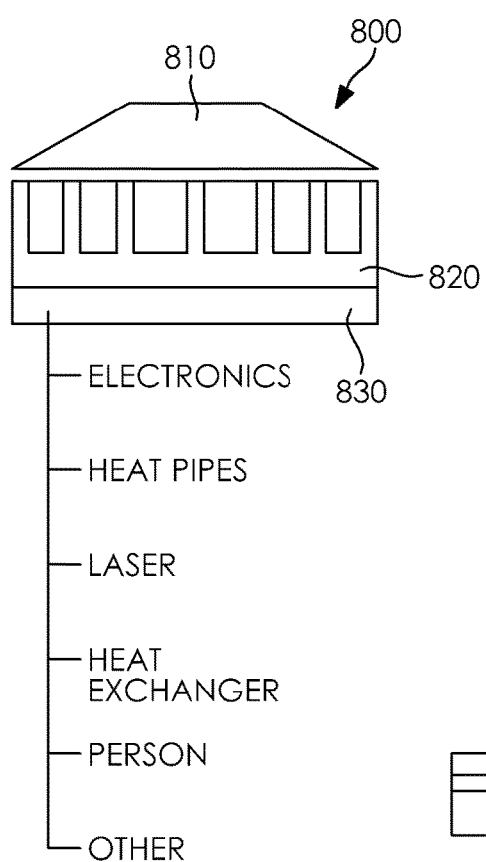
FIG. 17
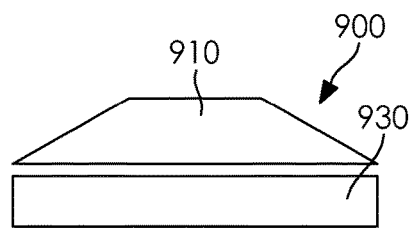
FIG. 18
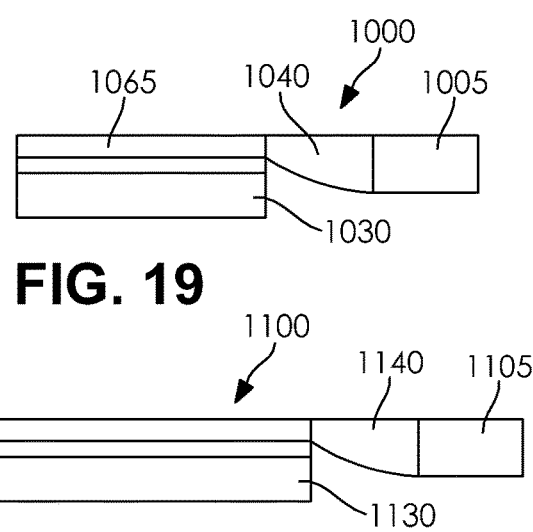
FIG. 19
FIG. 20

SYSTEM, METHOD, AND APPARATUS FOR PROVIDING COOLING

RELATED APPLICATIONS

This application claims the benefit of U.S. Provisional Patent Application Ser. No. 62/530,772 filed Jul. 10, 2017, which is hereby incorporated by reference in its entirety.

TECHNICAL FIELD

The present disclosure generally relates to a system, method, and apparatus for providing cooling, and more particularly to a system, method, and apparatus for providing cooling of a heat source.

BACKGROUND

For cooling many sources of heat, there are a number of common methods: single phase, sensible cooling, and two-phase cooling, which can involve a combination of sensible cooling (due to the temperature difference between the cooling fluid and the heat source) as well as cooling due to the evaporation of the second phase of coolant (often air and water, with water serving to provide significant cooling via evaporation).

The introduction of two phase cooling instead of one phase cooling can provide strong benefits by significantly increasing the rate of heat exchange over sensible cooling alone. Many heat sources can stand to benefit from conducting two-phase cooling on them.

For example, computer processing chips are often cooled via a heat sink that has forced air blown over it. Thermal limitations often restrict the performance of the chips. Increasing the rate of heat transfer via a two-phase process could remove this thermal limitation. It may also provide other benefits to the system such as reducing supporting hardware (e.g., air conditioners and cooling towers).

However, there are significant challenges in implementing two-phase cooling. It often involves the use of spray heads and associated hardware. These spray heads can cover a limited surface area or involve a large amount of space to allow the spray to spread to larger surface areas. Thus, many spray heads could be used to facilitate suitable spray. Introducing air flow over the heat source to speed evaporation of the droplets may blow the droplets in undesirable directions.

These challenges have limited the applicability of two-phase cooling to a more limited set of situations, such as cooling towers, where there is ample volume to operate spray heads. One additional type of heat load that can benefit from two-phase cooling is metabolic heat from people.

Conventional techniques exist for direct cooling of people outside of climate-controlled environments. As discussed below, these conventional techniques typically fail based on lacking effectiveness and/or involving excessive system weight.

Conventional evaporative vests hold a quantity of water that is absorbed into their fabrics and associated absorbent material. Airflow around the vest evaporates the absorbed water and leads to a cooling effect. However, conventional evaporative vests do not work well under other garments such as bullet proof vests or motorcycle jackets. These conventional items also typically rely on a stream of air being provided via wind or other sources to operate. Accordingly, conventional evaporative vests operate poorly in high humidity conditions having little or no wind. Also, the amount of water that conventional systems can store is limited and recharging the water in these systems often involves removal of a vest or garment by a user. Evaporation typically occurs on an exterior layer of conventional garments, indirectly cooling the body because the garment is first cooled, followed by the body being cooled. This indirect cooling results in a reduction in cooling power and poor efficiency in water use. Also, if a region of the vest becomes dry, that region acts as an insulator and makes a wearer warmer instead of cooler.

Conventional forced convection techniques include forced convection arrangements and operate with a fan that supplies external ambient air to a person's body. This air may cool a person by evaporating sweat off the wearer or by sensible cooling due to a temperature differential between the skin of the wearer and the air. The sensible cooling component drops off as temperatures rise, becoming zero when the air temperature is equal to the skin temperature (roughly 93 degrees F.). Exterior temperatures in many environments can easily exceed this level and at this point, blowing outside air across a person's body can be counterproductive unless there is a sufficient supply of sweat on a given area. However, it is difficult to match forced convection to sweat presence on the skin of a user as most designs will evaporate from some areas closest to the air supply much more quickly than areas of the body distant from the air supply. Also, since sweating will increase only as the body gets hotter and less comfortable, the effectiveness at keeping the wearer comfortable will be limited.

Conventional cold storage solutions may include a vest or other garment having pouches that hold either ice or other phase change material. These items are often charged by placing them in a freezer and then worn once frozen. However, cold storage solutions involve a relatively short amount of duration of use. These items are most effective when fully frozen, but will start to lose effectiveness as they thaw and will eventually lose substantially all efficacy. Also, melting provides less cooling power per unit than evaporation (e.g., the latent heat of vaporization is multiples higher than the latent heat associated with melting). These techniques also involve a freezer to charge, which may not always be available.

Conventional chilled water cooling solutions typically cool a person's body using coils of flexible tubing in a vest that carry chilled water in close contact with the body. The water is typically chilled by a vapor compression system, ice, or by thermoelectric means. Conventional chilled air solutions operate similarly to chilled water systems, utilizing vapor compression, ice, or thermoelectrics to cool. Chilled water and chilled air can provide an improvement in efficacy of cooling over evaporative vests and forced convection cooling systems, but generally involve significant electrical power and/or large ice storage reserves to operate. This results in heavy and expensive batteries and/or ice reservoirs. In the case of vapor compression or thermoelectric systems used to cool the air or water fluid below ambient temperatures, these systems themselves add significant weight (e.g., based on compressors, heat exchangers, thermoelectric elements, and/or batteries). The amount of cooling power these systems may provide is limited by weight for mobile applications in which the wearer wants to move around with minimal encumbrance. These systems are also costly.

The exemplary disclosed system and method are directed to overcoming one or more of the shortcomings set forth above and/or other deficiencies in existing technology.

SUMMARY OF THE DISCLOSURE

In one exemplary aspect, the present disclosure is directed to an apparatus. The apparatus includes a cooling fluid passage, a gaseous fluid blower disposed at an upstream portion or a downstream portion of the cooling fluid passage, and a liquid droplet sprayer disposed at the upstream portion of the cooling fluid passage. A surface portion of the cooling fluid passage is hydrophobic.

In another aspect, the present disclosure is directed to a method. The method includes providing a gaseous fluid flow in a passage, spraying liquid droplets into the gaseous fluid flow, repelling the liquid droplets in the gaseous fluid flow from a surface of the passage, and directing the gaseous fluid flow including the liquid droplets to a heat source. Repelling the liquid droplets includes maintaining a size of the liquid droplets.

BRIEF DESCRIPTION OF THE DRAWINGS

FIG. 1 illustrates a rear view of an exemplary system of the present invention;
FIG. 2 illustrates a front view of an exemplary system of the present invention;
FIG. 3 illustrates a perspective view of an exemplary system of the present invention;
FIG. 16 illustrates a schematic view of an exemplary system of the present invention;
FIG. 17 illustrates a schematic view of an exemplary system of the present invention;
FIG. 18 illustrates a schematic view of an exemplary system of the present invention;
FIG. 19 illustrates a schematic view of an exemplary system of the present invention;
and
FIG. 20 illustrates a schematic view of an exemplary system of the present invention.

DETAILED DESCRIPTION AND INDUSTRIAL APPLICABILITY

Figure 4:
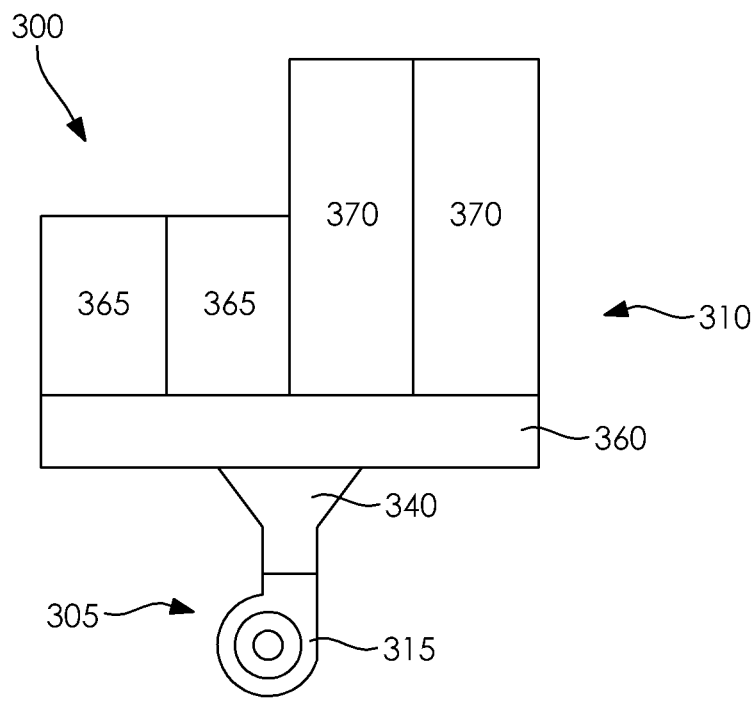
FIG. 4 illustrates a schematic view of an exemplary system of the present invention.

FIGS. 1, 2, and 3 illustrate an exemplary system 300. System 300 may for example be worn by a user 100. For example, user 100 may wear system 300 under apparel, accessories, and/or equipment. A user may wear system 300 under military or law enforcement uniforms and equipment, utility wear and equipment such as firefighting wear and equipment, athletic wear and equipment such as football uniforms and equipment, outdoor wear, and/or street wear. For example, system 300 may be worn under military or law enforcement protective body armor. Also for example, system 300 may be worn by a user under any clothing, apparel, accessories, and/or equipment worn in relatively warm temperatures. In at least some exemplary embodiments, system 300 may be a two-phase hydrophobic channel cooling device as described for example below.

As illustrated in FIGS. 1, 2, and 3, system 300 may include a cooling system 305 and a flow assembly 310. Cooling system 305 may operate to cool a heat source via flow assembly 310. Relative to the exemplary flow described below, cooling system 305 may be disposed upstream from or at an upstream portion of flow assembly 310. Also for example, some portions of cooling system 305 may be disposed at a downstream portion of flow assembly 310. The exemplary flow may flow in a flow direction that moves from upstream (e.g., a given upstream location) to downstream (e.g., a given downstream location).

Cooling system 305 may include at least one blower 315, a power source 320, a pump 325, a reservoir 330, an injection assembly 335, a manifold passage 340, and a controller 345. Controller 345 may control power source 320 to power pump 325 and blower 315 to operate to draw a cooling fluid from reservoir 330 via injection assembly 335 and to provide a flow including the cooling fluid through flow assembly 310 as described for example below.

The exemplary cooling fluid may be any suitable fluid for cooling a heat source. The cooling fluid may be a gaseous fluid, a liquid fluid, and/or a mixture of gaseous fluids and liquid fluids. For example, the cooling fluid may be an airflow including liquid droplets such as water droplets. The cooling fluid may be an airflow including a spray such as a water spray of water droplets. The cooling fluid may also be an airflow including liquid droplets made up of water, ethylene, propylene glycol, and/or any other suitable coolant. For example, the cooling fluid may include an airflow having a spray that includes one of or a mixture of water, ethylene, propylene glycol, and/or any other suitable coolant. The cooling fluid may also include any gaseous fluid other than air or a mixture of air and other gaseous fluids that may entrain liquid droplets of the exemplary materials described above. The exemplary cooling fluid may be any gaseous fluid, liquid fluid, and/or mixture of gaseous and liquid fluid material that may be repelled by a hydrophobic and/or super-hydrophobic surface as described for example below to substantially prevent agglomeration of liquid droplets in the cooling fluid (e.g., airflow).

Blower 315 may be any suitable device for blowing fluid such as air, air mixed with water or other fluids, and/or any other suitable fluid through flow assembly 310. Blower 315 may be any suitable device for blowing the exemplary cooling fluid described above. For example, blower 315 may be a fluid mover such as an air mover, a fan of axial or centrifugal type, or any other suitable type of blower or fan for moving a fluid such as air or a mixture of air and one or more fluids. Also for example, blower 315 may be a fluid source such as a pressurized fluid source (e.g., a source of pressurized air or other pressurized gaseous fluid). Blower 315 may for example be arranged in a "push" or a "pull" (e.g., suction) configuration. For example, blower 315 may be disposed at an upstream portion of system 300 in a "push" configuration or at a downstream portion of system 300 in a "pull" configuration.

Power source 320 may be any suitable power supply for powering components of system 300. Power source 320 may be a plug or other connection for an electricity supply source such as an electrical outlet or a generator. For mobile applications, power source 320 may be a battery or other suitable source of energy. For example, power source 320 may be an electric power source such as, e.g., an electric power storage device, a solar-powered power storage device, and/or any other suitable type of power source. Power source 320 may include a primary cell battery and/or a secondary cell battery. In at least some exemplary embodiments, power source 320 may include a lithium battery, a lithium-ion battery, an alkaline battery, a nickel-cadmium battery, and/or a zinc-carbon battery.

Pump 325 may be any suitable pump for pressurizing a liquid fluid (e.g., liquid) stored in reservoir 330 and pressurizing a flow of the liquid through injection assembly 335. Pump 325 may be any suitable type of pump such as, for example, a piezo electric pump, a diaphragm pump, a centrifugal pump, or an impeller type pump.

Reservoir 330 may be any suitable reservoir for storing a liquid fluid. Reservoir 330 may store water and/or any other exemplary cooling fluid described above. It is also contemplated that reservoir 330 may store a gaseous fluid or a fluid including a mixture of gaseous fluid and liquid fluid. Reservoir 330 may store an unpressurized or pressurized fluid. Reservoir 330 may be a rigid or flexible reservoir. For example, reservoir 330 may be a flexible bladder formed from a polymer material, elastomeric material, and/or any other suitable type of material. Reservoir 330 may also be formed from a flexible or rigid plastic material or metal.

Injection assembly 335 may be any suitable assembly for fluidly connecting pump 325, reservoir 330, and manifold passage 340. Injection assembly 335 may include an injection portion 350 and a passage 355. Injection portion 350 may be an injection tip formed from rigid pipe or tubing. For example, injection portion 350 may be narrow-wall and/or narrow-diameter tubing (e.g., needle tubing) in order to provide liquid fluid such as water or any other exemplary cooling fluid described above from reservoir 330 to blower 315. In at least some exemplary embodiments, injection assembly 335 may include a plurality of injection portions 350. Injection portion 350 may be disposed in, at, or near blower 315. Injection portion 350 may be connected to pump 30 via passage 355. Passage 355 may also connect pump 30 to reservoir 330. Passage 355 may be tubing or pipe. For example, passage 355 may be flexible tubing or pipe such as flexible PVC.

Controller 345 may be any type of programmable logic controller known in the art for automating machine processes. Controller 345 may be made from any material known in the art for logic control devices, and may include a protective housing of metal, plastic, or another durable material. Controller 345 may include input/output arrangements that allow it to be connected to other components of cooling system 305. Controller 345 may utilize digital or analog techniques for processing input from a user interface (e.g., any suitable user interface disposed on any portion of system 300 or associated with system 300) to create output for controlling system 300. Controller 345 may communicate with the various components of system 300 through a number of electrical lines and/or through wireless data transmission. Controller 345 may therefore be capable of processing and executing operator's commands to operate system 300. For example, controller 345 may be electrically connected to one or more blowers 315, as well as to pump 325 and power source 320. Controller 345 may also be connected to any suitable sensors of system 300. For example, controller 345 may be connected to one or more sensors of system 300 that may sense temperature data, humidity data, pressure data, and/or any other desired type of data. For example, controller 345 may be used to monitor a variety of control parameters, such as the temperature and humidity of the air and/or temperature of the object (e.g., heat source) to be cooled. Based on these and other exemplary parameters, controller 345 may turn blower 315 on or off, change a speed of blower 315, and/or change a flow rate of liquid (e.g., water or any other exemplary cooling fluid described above) or a duty cycle of pump 325. For example, controller 345 may monitor any desired control parameter to for example vary an airflow and/or water flow rate of system 300 (e.g., or flow rate of any other exemplary cooling fluid described above).

As illustrated in FIGS. 1 and 2, cooling system 305 may be disposed on a torso of a user. For example, blower 315 may rest below flow assembly 310 in the vicinity of the user's hips. Flow assembly 310 may cover a user's torso below the chest area as illustrated in FIG. 2, and/or any other portion of a user (e.g., chest, arms, and/or legs). For example, flow assembly 310 may continue from the hips up to the shoulders of a user, covering a relatively large surface area of a user's back as illustrated in FIG. 1. Also as illustrated in FIG. 1, cooling system 305 may be disposed at a user's back and/or any other desired location.

As schematically illustrated in FIG. 4, flow assembly 310 may include a connecting passage 360, one or more passages 365, and one or more passages 370. Connecting passage 360 may connect manifold passage 340 of cooling system 305 with one or more passages 365 and 370. For example, passages 360, 365, and 370 may be a plurality of sub-duct components and/or duct components that form flow assembly 310. Some or substantially all of passages 360, 365, and/or 370 may include apertures (e.g., holes or pores) on their respective bottom surfaces (e.g., facing a user or other heat source) as described for example below. For example, some of passages 360, 365, and/or 370 may have apertures and some may not have apertures. Manifold passage 340 may similarly either have exemplary apertures or not have exemplary apertures as described for example below. Manifold passage 340 may have internal vanes that may direct a flow of cooling fluid within system 300. Also for example, passages 360, 365, and/or 370 may include internal vanes for directing flow of cooling fluid within flow assembly 310. In at least some exemplary embodiments, connecting passage 360 may run in a substantially horizontal direction and may attach to a plurality of passages 365 and 370. Also for example, passages 360, 365, and 370 may form any desired arrangement based on a configuration, shape, and/or size of flow assembly 310. In at least some exemplary embodiments, manifold passage 340 may spread and distribute cooling fluid (e.g., water spray and air or any other exemplary cooling fluid described above) into passages 360, 365, and 370, but may not allow an exit of cooling fluid directly from manifold passage 340 to a heat source. Also for example, passages 340, 360, 365, and 370 may both distribute cooling fluid to other passages and directly deliver spray to a user's skin.

Figure 5:
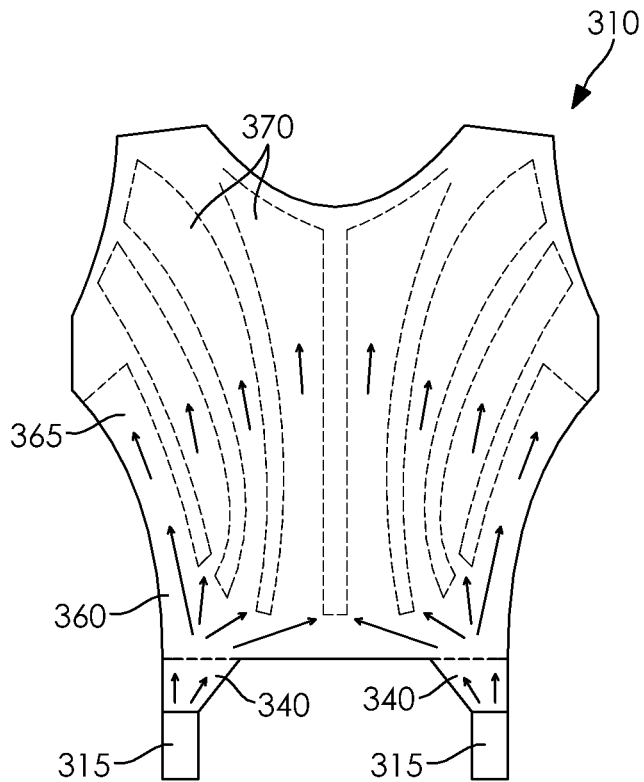
FIG. 5 illustrates a schematic front view of an exemplary apparatus of the present invention.
Figure 6:
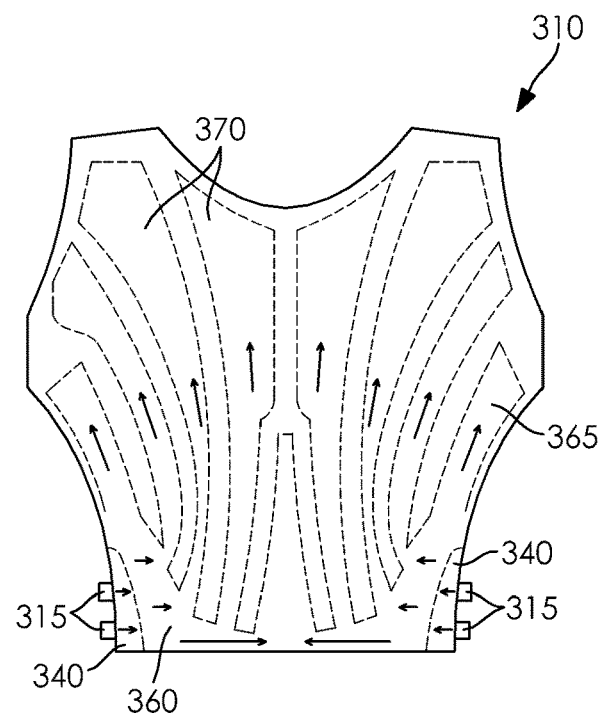
FIG. 6 illustrates a schematic front view of an exemplary apparatus of the present invention.
Figure 7:
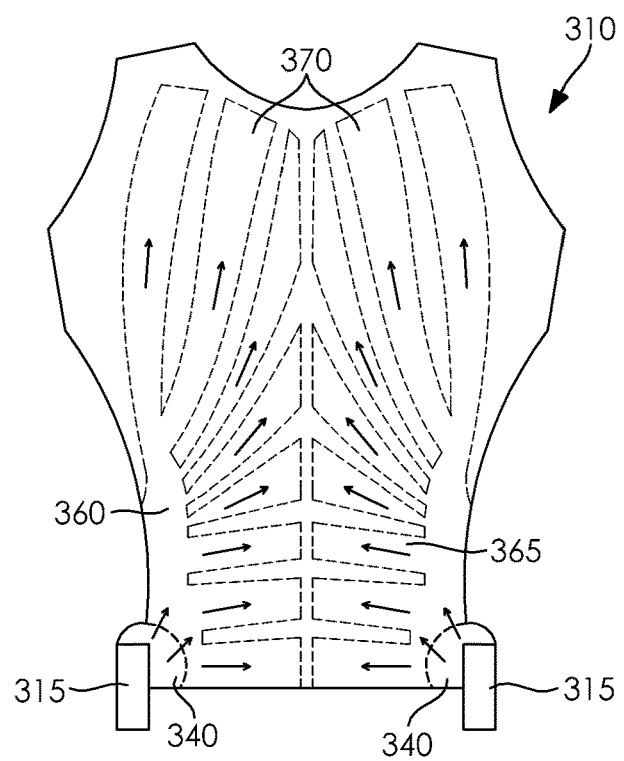
FIG. 7 illustrates a schematic front view of an exemplary apparatus of the present invention.

FIGS. 5, 6, and 7 illustrate exemplary embodiments of flow assembly 310. For example, the exemplary embodiments may be used in flow assembly 310 that may cover a torso of a user. Also for example, any desired arrangement of passages 360, 365, and/or 370 may be used to provide flow of cooling fluid to any desired arrangement of flow assembly 310 (e.g., covering a torso, arms, legs, and/or any other portion of a user's body).

Components of flow assembly 310 (e.g., and/or components of cooling system 305) may be formed from any suitable materials for facilitating flow such as, for example, polymer material, structural metal (e.g., structural steel), co-polymer material, thermoplastic and thermosetting polymers, resin-containing material, polyethylene, polystyrene, polypropylene, epoxy resins, phenolic resins, Acrylanitrile Butadiene Styrene (ABS), Polycarbonate (PC), Mix of ABS and PC, Acetal (POM), Acetate, Acrylic (PMMA), Liquid Crystal Polymer (LCP), Mylar, Polyamid-Nylon, Polyamid-Nylon 6, Polyamid-Nylon 11, Polybutylene Terephthalate (PBT), Polycarbonate (PC), Polyetherimide (PEI), Polyethylene (PE), Low Density PE (LDPE), High Density PE (HDPE), Ultra High Molecular Weight PE (UHMW PE), Polyethylene Terephthalate (PET), PolPolypropylene (PP), Polyphthalamide (PPA), Polyphenylenesulfide (PPS), Polystyrene (PS), High Impact Polystyrene (HIPS), Polysulfone (PSU), Polyurethane (PU), Polyvinyl Chloride (PVC), Chlorinated Polyvinyl chloride (CPVC), Polyvinylidenefluoride (PVDF), Styrene Acrylonitrile (SAN), Teflon TFE, Thermoplastic Elastomer (TPE), Thermoplastic Polyurethane (TPU), and/or Engineered Thermoplastic Polyurethane (ETPU), rubber or silicone rubber or any suitable combination thereof.

Figure 8:
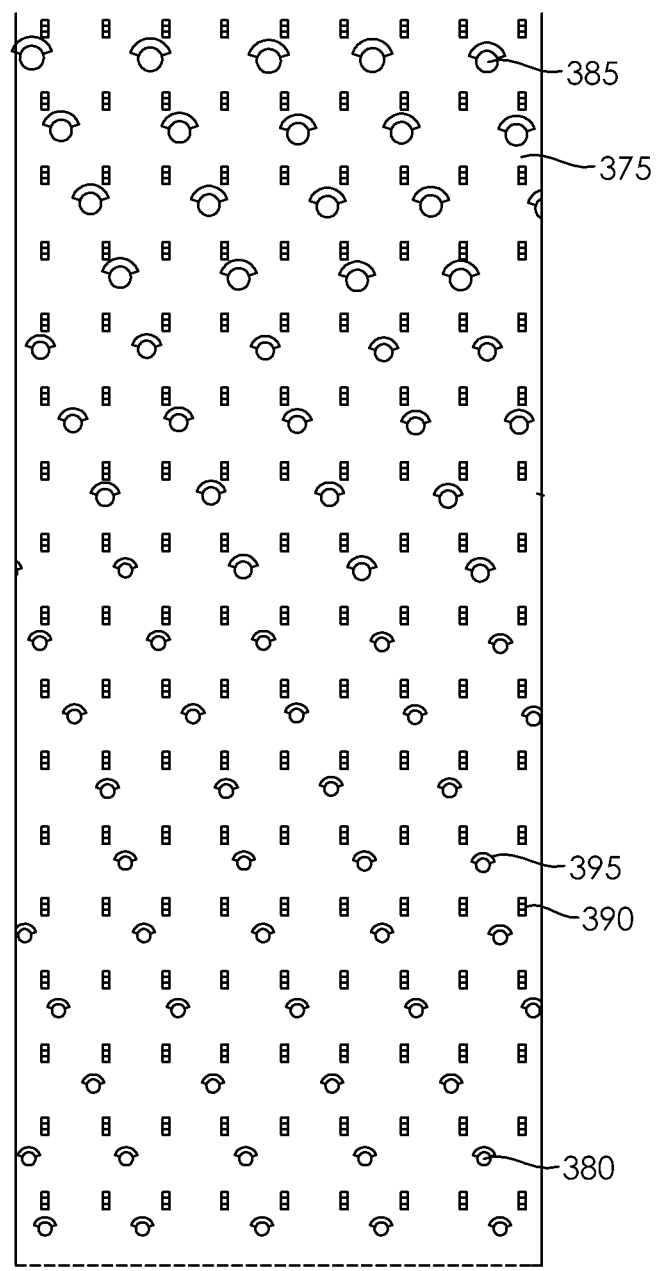
FIG. 8 illustrates a plan view of an exemplary apparatus of the present invention.

FIG. 8 illustrates a surface portion 375 that may be an exemplary interior surface portion (e.g., having an interior surface) of passage 370. Passages 340, 360, and/or 365 may also have surface portions including similar features as surface portion 375. Surface portion 375 may include a plurality of apertures. The apertures may have varying aperture sizes. For example as illustrated in FIG. 8, the apertures may vary in size from an aperture 380 having a relatively small aperture size (e.g., diameter) to an aperture 385 having a relatively large aperture size. For example, apertures may gradually increase (e.g., incrementally increase) in size in a direction moving from aperture 380 to aperture 385. Aperture sizes may also be random, follow a pattern of size changes, and/or be of similar sizes. Surface portion 375 may also include a plurality of protrusions 390 (e.g., pylons) that may support a surface portion (e.g., top surface portion as described for example below) that may be disposed on surface portion 375. Surface portion 375 may further include protrusions 395 that may be disposed at the exemplary apertures (e.g., apertures 380 and 385). Protrusions 395 may also support a top surface portion as described for example below. Protrusions 395 may for example be curved or semi-circular in shape and may be disposed at a rear (e.g., adjacent downstream side) of the exemplary apertures (e.g., relative to a direction of flow of cooling fluid through the exemplary passages). Protrusions 390 and/or 395 may be integrally formed with surface portion 375. Surface portion 375 including protrusions 390 and/or 395 may be formed via injection molding, 3-D printing, or any other suitable technique.

In at least some exemplary embodiments, one or more passages may include a gradient of aperture sizes (e.g., from small to large). While initially there may be a greater flow rate of air and water droplets (e.g., or any other exemplary cooling fluid described above) in the stream of cooling fluid over relatively smaller apertures, this flow rate will drop as more and more flow exits. Accordingly, the aperture size (e.g., of aperture 380 and aperture 385) may increase as the flow rate decreases, which may allow near equal amounts of air and water droplets (e.g., or any other exemplary cooling fluid described above) to exit along the passage. This may help system 300 to cool a heat source that has a relatively uniform distribution of heat. Also for example if uneven cooling is desired (e.g., more cooling is desired in one location than another), aperture sizes and/or locations may be adjusted to accommodate accordingly.

In at least some exemplary embodiments, protrusions 395 may also help to control a flow of cooling fluid (e.g., of spray and air) by helping to set a desired airflow and droplet flow through the exemplary apertures (e.g., apertures 380 and 385). For example, a relatively smaller droplet size may match a flow path of the airflow more closely than a relatively larger droplet moving in an airflow. An aperture having a protrusion 395 may catch more droplets of liquid (e.g., water or any other exemplary cooling fluid described above) than an aperture without a protrusion 395 (e.g., and/or larger protrusions 395 may catch more droplets than smaller protrusions 395). Protrusions 395 may be of any desired shape, size, and/or design for controlling two-phase flows. For example, protrusions 395 may be configured as desired to alter airflow and/or droplet flow characteristics, including a ratio of airflow to droplet flow through an aperture (e.g., aperture 380 or aperture 385).

Figure 9:
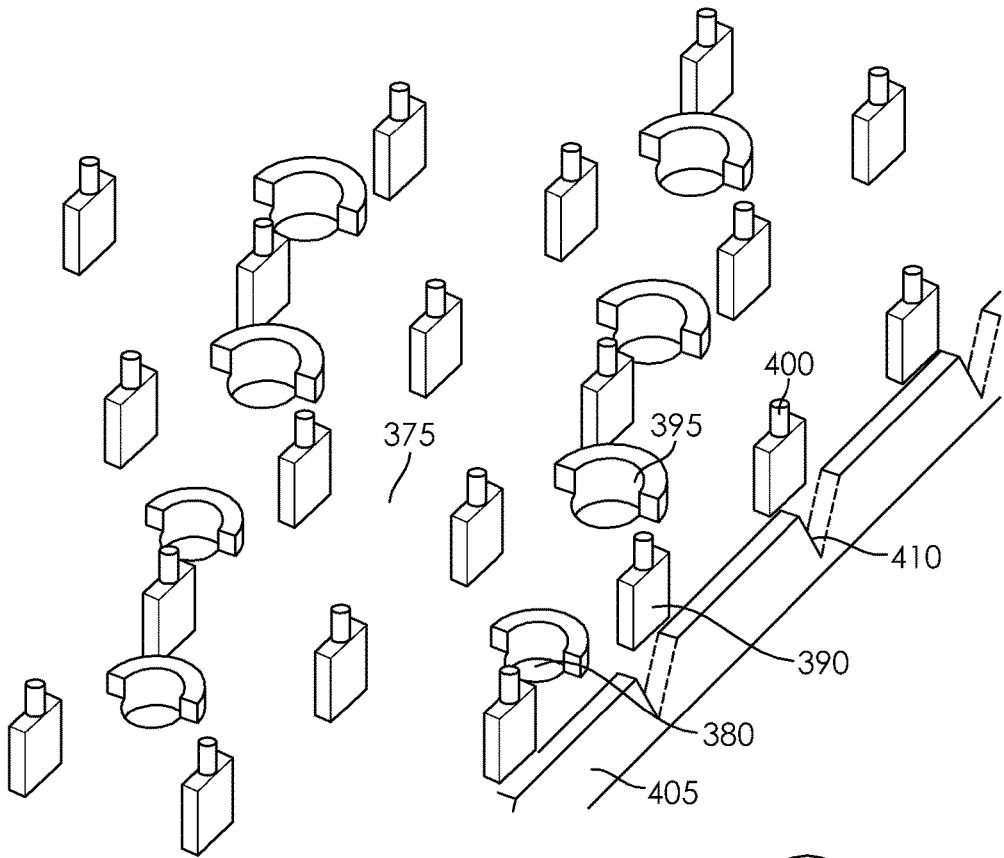
FIG. 9 illustrates a perspective view of an exemplary apparatus of the present invention.

FIG. 9 illustrates a detailed perspective view of surface portion 375 of passage 370 (e.g., passages 340, 360, and/or 365 may have surface portions including similar features). Protrusions 390 may include a portion 400 that may be disposed at an upper portion of protrusion 390 (e.g., at an end portion of protrusion 390 disposed away from surface portion 375). Portion 400 may have any suitable shape such as, for example, a cylindrical shape, rectangular or square shape, and/or a polygonal shape.

Surface portion 375 may include a wall portion 405 (e.g., side wall). Wall portion 405 may be perforated by cutouts and may include recesses 410. Recesses 410 may be triangular sidewall cutouts from wall portion 405.

Figure 10:
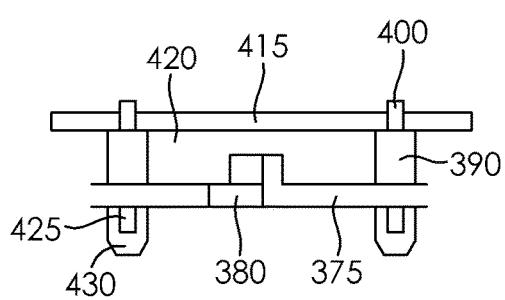
FIG. 10 illustrates a side view of an exemplary apparatus of the present invention.

FIG. 10 illustrates a side view (cross-section) of passage 370 (e.g., passages 340, 360, and/or 365 may have surface portions including similar features). A surface portion 415 (e.g., top surface portion) may be disposed or attached on surface portion 375 (e.g., bottom surface portion) so that a cavity 420 is formed between surface portions 375 and 415. Surface portion 415 may form a top of cavity 420 (e.g., a duct) and may be formed from a flexible material. Surface portion 415 may include any suitable stretchable or expandable materials such as, for example, elastomeric material, natural rubber, synthetic rubber, neoprene, chloroprene, vinyl material, thermoplastic elastomers, or any other suitable type of material having suitable elastic properties. For example, surface portion 415 may be a flexible, thin layer of rubber. In at least some exemplary embodiments, surface portion 415 may be a ¹⁄₆₄" thick neoprene sheet with a 30A durometer. Surface portion 415 may be perforated to have a plurality of relatively small perforations that may align with and be pushed down to receive portions 400 of protrusions 390 as illustrated for example in FIG. 10. The perforations may be smaller than a diameter of portions 400 so that a seal is created by the elastic material of surface portion 415 fitting snugly around the portions 400. Protrusion 390 may serve to support surface portion 415 and maintain a desired size of cavity 420 (e.g., channel size) that may be relatively constant during an operation of system 300. For example, protrusion 390 may support surface portion 415 in order to allow airflow and droplet flow through cavity 420 without pinching or bulging, and while still allowing the exemplary duct to be flexible during operation and conform to any curved surfaces (e.g., of a user). Wall portion 405 may also be flexible, with recesses 410 configured to add additional flexibility.

As illustrated in FIG. 10, passage 370 may also include a plurality of protrusions 425 disposed on an exterior surface of surface portion 375 (e.g., on a surface opposite from the interior surface having protrusions 390). Passages 340, 360, and/or 365 may include similar features. Protrusions 425 may protrude from a bottom exterior surface of passage 370 (e.g., from an exterior surface of surface portion 375) toward a heat source such as a user who is wearing flow assembly 310 under clothing and/or equipment. Protrusions 425 may be formed from similar material as surface portion 375 and may be integrally formed with surface portion 375 (e.g., similarly to protrusions 400). Portions 430 may be disposed on protrusions 425. Portions 430 may include material such as a fabric-covered rubber foam, neoprene material, and/or material similar to surface portion 415. For example, portions 430 may be formed from any material suitable for being comfortably worn by a user when flow assembly 310 including portions 430 is pressed against a user's body.

Protrusions 425 and portions 430 may serve to keep passages 340, 360, 365, and/or 370 suspended above a surface of a user's body, other heat sources, or other objects to be cooled. Protrusions 425 and portions 430 may thereby allow airflow and liquid droplet flow (e.g., water droplet and airflow or flow of any other exemplary cooling fluid described above) to move beneath the exemplary duct and disperse cooling fluid to a relatively wide region. Apertures 380 and/or 385 may have additional deflectors on an exterior portion of surface portion 375 (e.g., facing a heat source) to further direct the spray of cooling fluid as it exits the exemplary apertures (e.g., apertures 380 and/or 385).

Interior surfaces and/or surface portions of manifold passage 340, connecting passage 360, passages 365, and/or passages 370 may be hydrophobic and/or super-hydrophobic and/or coated with a hydrophobic and/or super-hydrophobic layer or coating. The exemplary hydrophobic surface (e.g., layer, portion, or coating) may for example tend to repel water or substantially repel water (or repel any other exemplary cooling fluid described above). The exemplary hydrophobic surface (e.g., layer, portion, or coating) may for example exhibit a contact angle with water that is greater than or equal to about 90 degrees (e.g., between about 90 degrees and about 150 degrees, or between about 90 degrees and about 175 degrees). A super-hydrophobic surface (e.g., layer, portion, or coating) may for example exhibit a contact angle with water that is greater than or equal to about 150 degrees (e.g., of between about 150 and about 175 degrees, of between about 150 degrees and about 179 degrees, or of between about 160 and about 175 degrees). At a contact angle that is greater than or equal to about 150 degrees, water (e.g., or any other exemplary cooling fluid described above) may substantially form a sphere (e.g., form nearly a sphere) on top of the super-hydrophobic portion and may not hold well (e.g., adhere) to the surface. The surface may be one known to achieve a Lotus Effect or "Cassie Regime". For example, the hydrophobic or super-hydrophobic surface may have a high tendency for water droplets to bounce off or be easily sheared off or pushed along the wall (e.g., the hydrophobic or super-hydrophobic surface may be highly repellant). For example, the hydrophobic and/or super-hydrophobic layer or coating may exhibit a restitution coefficient greater than 0, such that a droplet is able to bounce off the repellant surface. The restitution coefficient may be about 0.2 and about 0.95 when impacted with droplets of certain diameters and speeds (generally about 0.1 to 1 m/s and about 0.1 to 1 mm in diameter). At other speeds the droplets may splash into smaller droplets. In at least some exemplary embodiments, the hydrophobic and/or super-hydrophobic layer or coating may exhibit a restitution coefficient of about 0.9 to certain droplets. In at least some exemplary embodiments, the hydrophobic and/or super-hydrophobic layer or coating may be a water-repellant nanoscopic layer. The hydrophobic and/or super-hydrophobic layer or coating may include any suitable materials such as, for example, carbon nano-tube material, fluorinated silane or fluoropolymer material, manganese oxide polystyrene (MnO2/PS) nano-composite material, silica nano-coating material, precipitated calcium carbonate material, and/or zinc oxide polystyrene (ZnO/PS) nano-composite material.

For example as illustrated in FIG. 10, substantially all surfaces of passage 370 facing cavity 420 (e.g., surfaces of surface portion 375, surface portion 415, protrusions 390, wall portions 405, and any other desired portions) may be coated with the exemplary hydrophobic and/or super-hydrophobic layer or coating. Manifold passage 340, connecting passage 360, and/or passages 365 may be similarly coated.

Any suitable technique may be used to produce the exemplary hydrophobic surface and/or exemplary super-hydrophobic surface on system 300. For example, a super-hydrophobic spray (e.g., Rust-Oleum® NeverWet® 274232) may be utilized to provide super-hydrophobicity surfaces of passages 340, 360, 365, 370, and/or any other desired surfaces of system 300. Hydrophobic and/or super-hydrophobic coatings may be applied to components of system 300 prior to assembly to provide for substantially all surfaces forming cavity 420 (e.g., and/or cavities of some or all passages 340, 360, 365, and/or 370) to be substantially fully coated. In at least some exemplary embodiments, substantially all surfaces of passages 340, 360, 365, and/or 370 may be coated with super-hydrophobic material (e.g., and/or hydrophobic material). For example prior to assembly of passages, interior-facing surfaces may be coated (e.g., sprayed or dip-coated) with hydrophobic and/or super-hydrophobic material.

In at least some exemplary embodiments (using passage 375 as an example), an interior surface of surface portion 375 and interior surface of surface portion 415 may be coated when they are separate pieces (e.g., prior to assembly). Surface portions 375 and 415 may then be fastened together via adhesive (e.g., using adhesive to fasten portions 400 to perforated portions of surface portion 415) at an exterior surface of surface portion 415. For example, adhesive (e.g., which may not be hydrophobic and/or super-hydrophobic) may be applied at an exterior surface of surface portion 415 not facing cavity 420. In at least some exemplary embodiments, if adhesive does not bond well to the portions 400 that may be coated with a super-hydrophobic layer, a top of portions 400 protruding above surface portion 415 may be cut slightly shorter to expose untreated (e.g., non-hydrophobic) material to allow bonding with the adhesive. Accordingly for example by perforating (e.g., cutting slits) in surface portion 415 and pushing surface portion 415 down onto portions 400, cavity 420 (e.g., an interior of the duct) may be substantially entirely coated with hydrophobic and/or super-hydrophobic material. For example, cavity 420 may have no hydrophilic regions. Similar fabrication techniques may be used for manifold passage 340, connecting passage 360, and/or passage 365. Also for example, any suitable fabrication techniques for forming passage interiors (e.g., ducts) that are substantially entirely hydrophobic and/or super-hydrophobic may be used.

Figure 11:
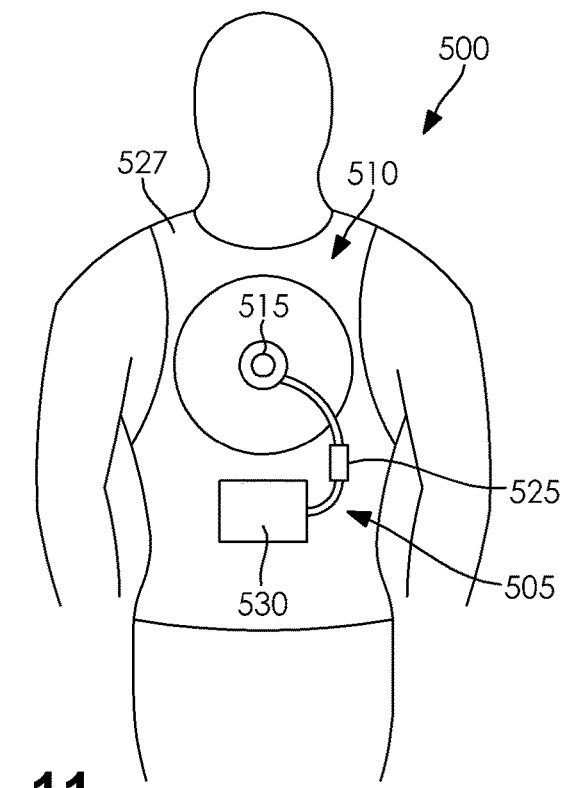
FIG. 11 illustrates a back view of an exemplary system of the present invention

FIGS. 11-15 illustrate system 500, another exemplary embodiment of the exemplary system. System 500 may have a cooling system 505 that is generally similar to cooling system 305 and a flow assembly 510 as described for example below. Cooling system 505 may include a blower 515 that may be similar to blower 315 but may be modified to have its side walls removed to form a 360 degree air source that distributes air in a 360 degree pattern (e.g., or portions of a 360 degree pattern) to flow assembly 510 that may be disposed around blower 515. For example, blower 515 may be disposed within flow assembly 510. FIG. 11 for example illustrates flow assembly 510 (e.g., super-hydrophobic coated flow assembly 510) disposed on a back of a user. A garment 527 (e.g., vest) may be used to secure system 500 to a torso of the user. A pump 525 that may be similar to pump 325 and a reservoir 530 that may be similar to reservoir 330 may be used as part of cooling system 505, along with components similar to power source 320, injection assembly 335, and controller 345.

In addition to the exemplary embodiment of attaching a single cooling system 505 to an upper portion of a user's back illustrated in FIG. 11, multiple cooling systems 505 of varying sizes may be attached to a user (e.g., via garment 527 or another attachment device) at various locations, and may be fed by a single pump 525 or a plurality of pumps 525 and reservoirs 530. Also for example, an intake manifold may be included to draw air from a user's waist, neck, and/or other region and into an inlet of blower 515.

Figure 12:
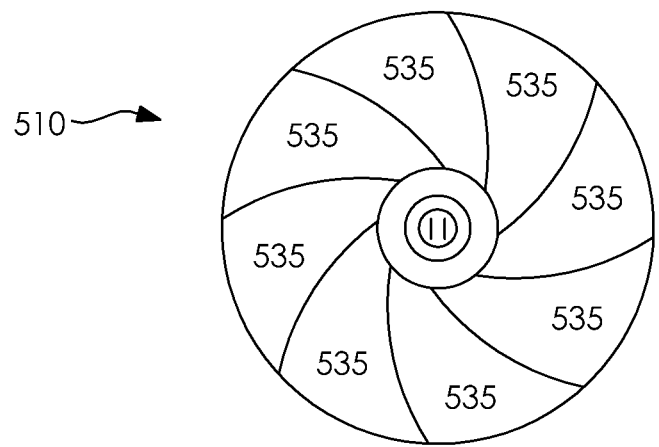
FIG. 12 illustrates a schematic front view of an exemplary apparatus of the present invention.
Figure 13:
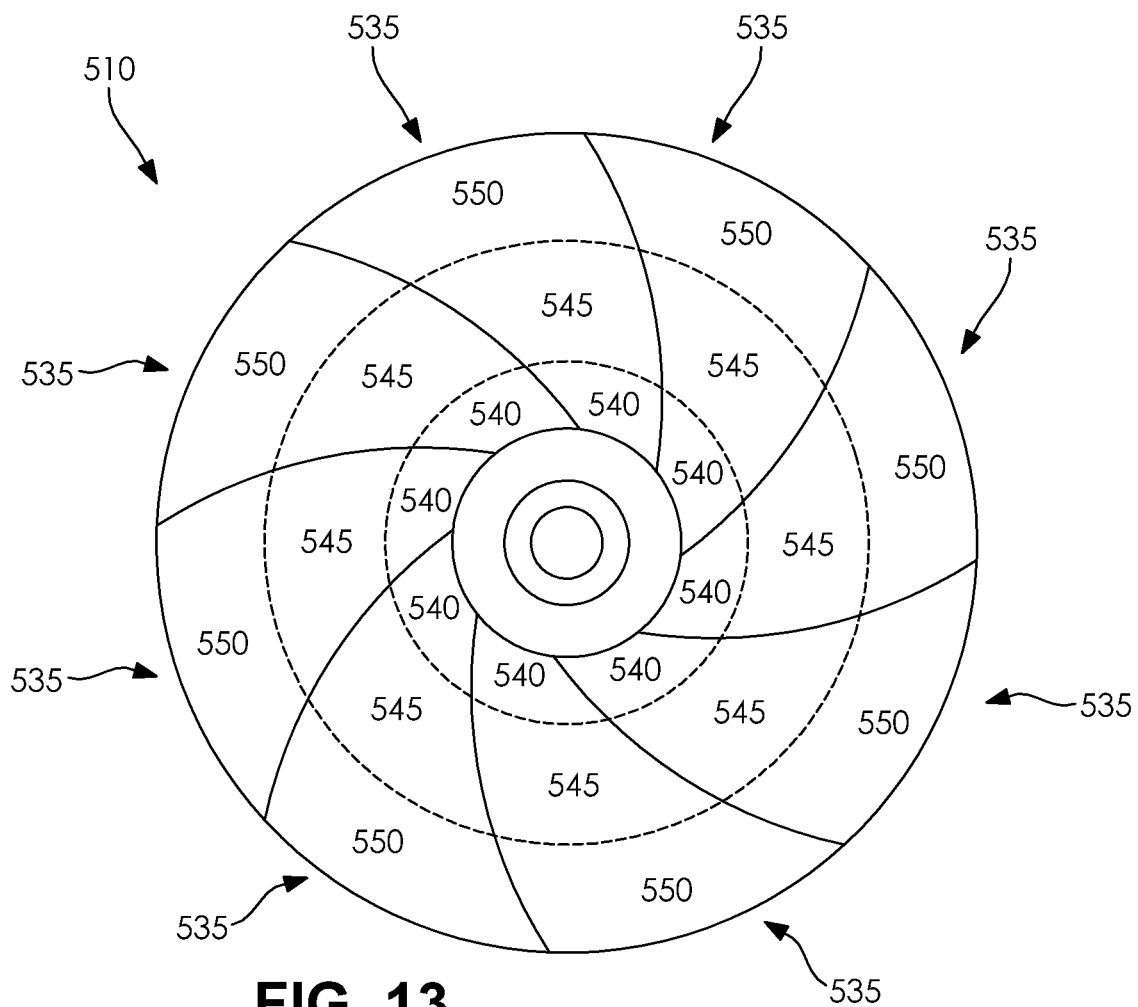
FIG. 13 illustrates a schematic front view of an exemplary apparatus of the present invention.

As illustrated in FIG. 12, flow assembly 510 may include a plurality of components 535. Components 535 may be radial sub-duct components that may be disposed in a radial arrangement. For example, flow assembly 510 may include any desired number of components 535, such as eight components 535 (e.g., or between four and 12 components 535, or any other desired number). As illustrated in FIG. 13 and as described for example further below, each component 535 may have a plurality of subcomponents. Each component 535 may have a subcomponent 540, a subcomponent 545, and a subcomponent 550 (e.g., or any other number of subcomponents such as two, four, or more subcomponents). Flow assembly 510 may be made from similar materials as flow assembly 310. For example, subcomponents 540, 545, and 550 may be formed from a rigid plastic material.

Figure 14:
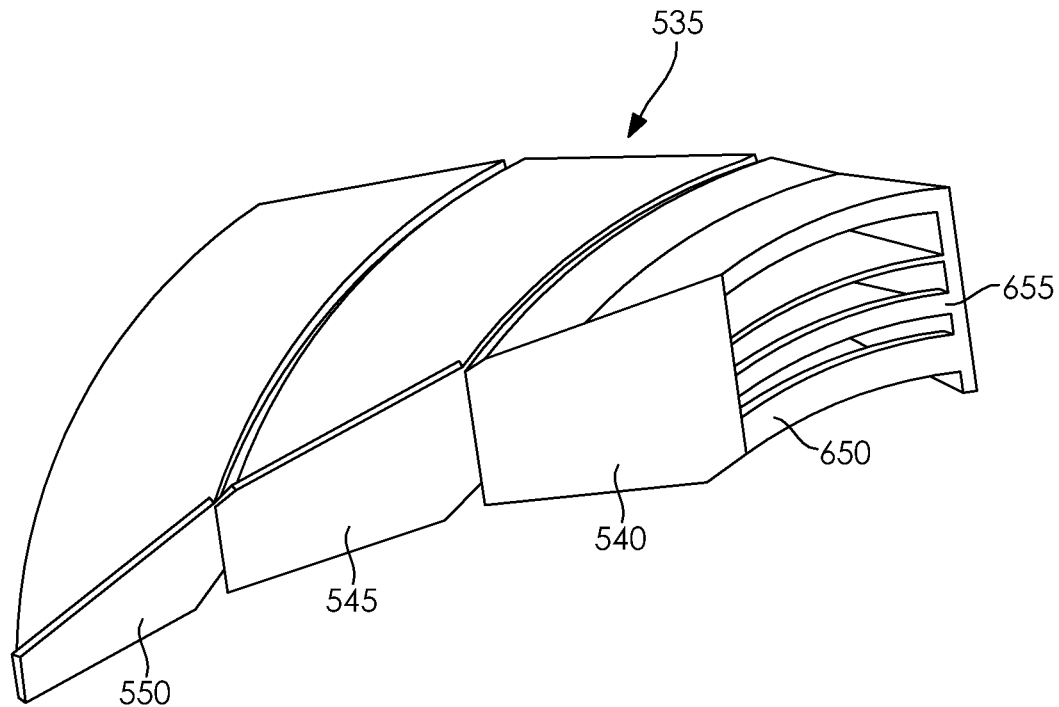
FIG. 14 illustrates a perspective view of an exemplary apparatus of the present invention.

FIG. 14 illustrates a perspective view of component 535 including subcomponents 540, 545, and 550. Subcomponents 540, 545, and 550 may include one or more protrusions 555 that may include portions similar to protrusion 425 and portion 430 described above (e.g., including fabric-covered rubber fabric or foam, neoprene material, and/or any other suitable material for contacting a user's body). Subcomponents 540, 545, and/or 550 may include one or more protrusions 555 (e.g., disposed at outside edges of subcomponents 540, 545, and/or 550) so that flow assembly 510 may be comfortably worn by a user (e.g., portions 555 may be comfortably pressed against a user's body).

In at least some exemplary embodiments, flow assembly 510 may be secured to a user's torso by garment 527 as illustrated in FIG. 11. Garment 527 may be elastic in order to stretch with the wearer's movements and provide some compression of the device against the wearer's body. Protrusion 555 may be similar in function to that of protrusion 425 and portion 430. Protrusions 555 may allow distribution of water droplets and airflow across a user's skin for cooling and for airflow to move out from underneath subcomponents 540, 545, and 550 (e.g., between flow assembly 510 and a user's skin).

Figure 15:
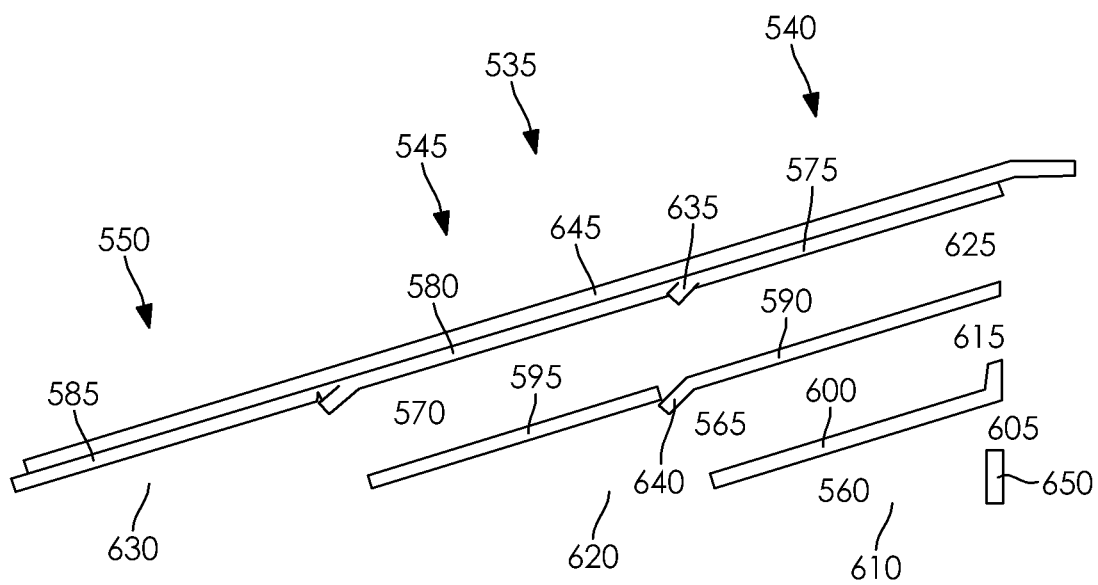
FIG. 15 illustrates a sectional view of an exemplary apparatus of the present invention.

FIG. 15 illustrates a cross-sectional view of a passage 560, a passage 565, and a passage 570 formed by wall portions of subcomponents 540, 545, and/or 550. An upper portion of passage 570 may be formed by a member 575, a member 580, and a member 585. A member 590 and a member 595 may form a dividing wall between passage 565 and passage 570. A member 600 may form a dividing wall between passage 560 and passage 565. Passage 560 may have an inlet 605 for receiving a flow of cooling fluid (e.g., air mixed with water or any other exemplary cooling fluid described above) from blower 515 and an outlet 610 (e.g., facing a user's body). Passage 565 may have an inlet 615 for receiving a flow of cooling fluid from blower 515 and an outlet 620 (e.g., facing a user's body). Passage 570 may have an inlet 625 for receiving a flow of cooling fluid from blower 515 and an outlet 630 (e.g., facing a user's body). A flow of cooling fluid may thereby be pushed through passages 560, 565, and 570 against a body of a user based on an operation of blower 515.

A declined or inclined deflector portion (e.g., portion 635, portion 640, and similar portions) may be included on members 575, 580, and 590 to help facilitate movement of subcomponents 540, 545, and 550 relative to each other. Also a layer 645 that may be formed from similar material as surface portion 415 may be disposed on (e.g., attached to) members 575, 580, 585, and or side portions of flow assembly 510. Layer 645 may be a thin elastic material. Subcomponents 540, 545, and 550 may be adhered to layer 645 so that layer 645 covers some or substantially all of a top surface (e.g., a surface facing away from a user wearing system 500) and side surfaces of flow assembly 510. Layer 645 may thereby join the plurality of components 535 together on the top and sides of flow assembly 510. Layer 645 may also serve to attach subcomponents 540 to blower 515. For example based on the elastic properties of layer 645 and a configuration of portions 635 and 640, subcomponents 540, 545, and 550 may move relative to each other to fit a contour of a user's body.

As illustrated in FIGS. 14 and 15, an inlet portion 650 may define a relatively narrow size of inlet 605, and an inlet portion 655 may define a relatively narrow size of inlet 615. Inlet portion 650 may be larger than inlet portion 655, which may make inlet 605 smaller than inlet 615. Inlet 625 may not have an inlet portion, and may thereby be larger than inlet 615. Based on the radial configuration of flow assembly 510 as illustrated in FIG. 13, outlets 630 may cover a surface area (e.g., facing a user's body) corresponding to subcomponents 550, which may be larger than a surface area covered by outlets 620 that may correspond to subcomponents 545. Outlets 610 may cover a surface area corresponding to subcomponents 540, which may be smaller than the surface area covered by outlets 620 and 630 based on the exemplary radial configuration illustrated in FIG. 13 for flow assembly 510. Accordingly for example, the relatively larger inlets 625 may transport a relatively larger amount of flow of cooling fluid via passages 570 from blower 515 to cover a relatively larger surface area covered by inlets 630 corresponding to subcomponents 550 (e.g., as compared to inlets 615 and 610). Further for example, inlets 615 that may be sized smaller than inlets 625 and larger than inlets 605 and may transport an amount of cooling fluid via passages 565 to inlets 620 that may be smaller than the amount carried by passages 570 but larger than the amount carried by passages 560. Based on proportionally sizing inlets 605, 615, and 625 to receive flow to correspond to surface area covered by outlets 610, 620, and 630, flow assembly 510 may thereby provide a substantially equivalent amount of cooling fluid to different portions of a user's body. The exemplary inlets may also be sized to provide uneven distribution of cooling if desired.

Flow assembly 510 may be coated with hydrophobic and/or super-hydrophobic material similarly to flow assembly 310 (e.g., to produce hydrophobic and/or super-hydrophobic passages 560, 565, and 570). Hydrophobic and/or super-hydrophobic coatings may be applied to surfaces of flow assembly 310 either before or after assembly (e.g., by spraying and/or dip-coating).

FIG. 16 illustrates another exemplary embodiment of the exemplary system. System 700 may include a fan 705. Fan 705 may be a fan or any other suitable fan for providing a flow through system 700. For example, fan 705 may be an axial fan. Fan 705 may be disposed in a passage 710. Passage 710 may be any suitable passage or channel for transporting flow such as, for example, a rigid or flexible duct. Passage 710 may have a surface 715 (e.g., interior surface) that may be a hydrophobic and/or super-hydrophobic surface similar to the exemplary passages described above. System 700 may also include an injection device 720 that may be connected to a pump 725 and a pump 730. Injection device 720 may be a spray head such as, for example, a two-phase spray head or any other suitable spray head for generating droplets. Pump 725 may be any suitable gaseous fluid pump such as an air pump and pump 730 may be any suitable liquid pump such as a water pump (or any suitable pump for pressurizing a flow of the exemplary cooling fluid described above). Pump 725 may alternatively be any suitable air source such as a pressurized air source. Pump 730 may be fluidly connected to a reservoir 735 that may be similar to reservoir 330. For example, reservoir 735 may be a water reservoir (or reservoir for any other exemplary cooling fluid described above). System 700 may also include a heat exchanger 740 that may be disposed in passage 710. Heat exchanger 740 may be for example a passive heat exchanger having any suitable configuration for removing heat from a heat source such as copper or aluminum fins. For example, heat exchanger 740 may be any suitable heat sink for transferring heat away from a heat source. In at least some exemplary embodiments, substantially all surfaces of passage 710, fan 705, and/or injection device 720 may be coated with hydrophobic and/or super-hydrophobic material. In at least some exemplary embodiments, heat exchanger 740 may not be coated with hydrophobic and/or super-hydrophobic material.

FIG. 17 illustrates another exemplary embodiment of the exemplary system. System 800 may include similar components as the above-described exemplary embodiments. System 800 may include a flow assembly 810 that may be generally similar to flow assembly 510. System 800 may also include a heat exchanger 820 that may be generally similar to heat exchanger 740. Heat exchanger 820 and flow assembly 810 may operate together to transfer heat away from a heat source 830. Heat source 830 may be any heat source such as, for example, an electronics device or assembly, a heating pipe, a laser device, another heat exchanger, a user such as a person, and/or any other source of heat.

FIG. 18 illustrates another exemplary embodiment of the exemplary system. System 900 may include similar components as the above-described exemplary embodiments. System 900 may include a flow assembly 910 that may be similar to flow assembly 810 and a heat source 930 that may be similar to heat source 830. System 900 may operate similarly to system 800, except that flow assembly 910 may directly remove heat from heat source 930.

FIG. 19 illustrates another exemplary embodiment of the exemplary system. System 1000 may include similar components as the above-described exemplary embodiments. System 1000 may include a cooling system 1005 that may be similar to cooling system 305, a manifold passage 1040 that may be similar to manifold passage 340, a passage 1065 that may be similar to passage 365, and a heat source 1030 that may be similar to heat source 830. System 1000 may operate generally similarly to system 300. Cooling system 1005 and passage 1065 may operate to remove heat either with or without use of a heat exchanger (e.g., similar to heat exchanger 820) from heat source 1030.

FIG. 20 illustrates another exemplary embodiment of the exemplary system. System 1100 may include similar components as the above-described exemplary embodiments. System 1100 may include a cooling system 1105 that may be similar to cooling system 305, a manifold passage 1140 that may be similar to manifold passage 340, a passage 1170 that may be similar to passage 370, and a heat source 1130 that may be similar to heat source 830. System 1100 may operate generally similarly to system 300. Cooling system 1105 and passage 1170 may operate to remove heat either with or without use of a heat exchanger (e.g., similar to heat exchanger 820) from heat source 1130.

In at least some exemplary embodiments, system 300 may include a cooling fluid passage (e.g., passages 340, 360, 365, 370, 560, 565, 570, 710, 1065, and/or 1170), a gaseous fluid blower (e.g., blower 315 or blower 515) disposed at an upstream portion or a downstream portion of the cooling fluid passage, and a liquid droplet sprayer (e.g., injection assembly 335) disposed at the upstream portion of the cooling fluid passage. A surface portion of the cooling fluid passage may be hydrophobic. A heat source (e.g., a user's body or heat source 830) may be disposed at a downstream portion of the cooling fluid passage. A surface portion of the cooling fluid passage may be super-hydrophobic. The gaseous fluid blower may be an air blower. The liquid droplet sprayer may be a water droplet sprayer. The surface portion of the cooling fluid passage may be water-repellant. The surface portion of the cooling fluid passage may have a water contact angle that is between about 150 degrees and about 175 degrees. System 300 may further include a reservoir and a pump that are fluidly connected to the liquid droplet sprayer.

In at least some exemplary embodiments, system 300 may include a first cooling fluid passage (e.g., passage 340), a gaseous fluid blower (e.g., blower 315 or blower 515) disposed at an upstream portion or a downstream portion of the first cooling fluid passage, a liquid droplet sprayer (e.g., injection assembly 335) disposed at the upstream portion of the first cooling fluid passage, and a plurality of second cooling fluid passages (e.g., passages 360, 365, 370, 560, 565, 570, and/or 710) disposed downstream of the first cooling fluid passage and fluidly connected to the first cooling fluid passage. A super-hydrophobic coating may be disposed on an interior surface of at least one of the plurality of second cooling fluid passages. The interior surface may include a plurality of apertures having different aperture sizes. A protrusion may be disposed on the interior surface at a downstream adjacent location of at least some of the plurality of apertures. The plurality of second cooling fluid passages may include a plurality of overlapping passages of different lengths that have different outlet surface areas. An inlet size may be proportionally sized to an outlet surface area and a passage length for each of the plurality of overlapping passages. The plurality of second cooling fluid passages may include a plurality of subcomponents that are movable relative to each other and that are attached together by a flexible top layer.

The exemplary disclosed system, method, and apparatus may be used in any suitable application for providing cooling. For example, the exemplary disclosed system, method, and apparatus may be used in providing cooling to a person or object. The exemplary system, method, and apparatus may be worn under apparel, accessories, and/or equipment of a user to provide cooling to the user. The exemplary system, method, and apparatus may also be used to provide cooling to any desired object such as, for example, electronics and computing systems, robotics components, interior spaces such as residential and commercial spaces, machinery and mechanical components, vehicles, and/or any other suitable electro-mechanical components. The exemplary system, method, and apparatus may further be used in any application involving the direct cooling of people located outside of climate controlled environments.

An exemplary operation of the exemplary disclosed system, method, and apparatus (e.g., as illustrated in FIGS. 1-10) will now be described. Pump 325 may draw liquid such as water from reservoir 330 via passage 355 to portion 350, which may provide liquid such as water to blower 315 (or any other exemplary cooling fluid described above). Blower 315 may both blow (e.g., smash) the stream of liquid emerging from portion 350 into relatively small droplets (e.g., generating a spray such as a water spray or a spray of any other exemplary cooling fluid described above) and create an air stream. The liquid (e.g., water or any other exemplary cooling fluid described above) to air ratio may be altered based on controller 345 controlling injection assembly 335 to provide more or less water (or any other exemplary cooling fluid described above) to the air stream created by blower 315.

The mixture of gaseous fluid and liquid fluid droplets (e.g., an airflow having water droplets or any other exemplary cooling fluid described above) may enter manifold passage 340. Many of the liquid droplets may collide with interior walls of manifold passage 340, which may be coated with a hydrophobic and/or super-hydrophobic coating. Based on the hydrophobic and/or super-hydrophobic coating, the liquid droplets (e.g., water droplets or any other exemplary cooling fluid described above) may not stick to the interior walls of manifold passage 340, but instead may immediately bounce off the interior walls and/or become sheared off of the interior walls by aerodynamic forces caused by blower 315 and be re-immersed into the air stream. Agglomeration of the liquid droplets into larger droplets may be kept to a minimum based on the hydrophobic and/or super-hydrophobic coating of the interior walls.

The hydrophobic and/or super-hydrophobic coating may substantially prevent liquid droplets from sticking to the interior walls for extended periods of time. For example, the hydrophobic and/or super-hydrophobic coating may prevent droplets from remaining on the interior walls and may prevent additional droplets from colliding with those droplets to form increasingly larger droplets that may drop down the interior walls by gravity or be pushed along the interior walls by aerodynamic forces caused by blower 315. For example, hydrophobic and/or super-hydrophobic coating may substantially prevent agglomeration (e.g., minimize or substantially prevent combinations of droplets from becoming larger droplets). As described for example below, a similar effect may occur on any surfaces that have been coated with hydrophobic and/or super-hydrophobic material (e.g., surfaces of passages 360, 365, and 370).

The mixture of gaseous fluid and liquid fluid droplets (e.g., mixture of air and water droplets or any other exemplary cooling fluid described above) may flow through flow assembly 310 by exiting manifold passage 340, flowing into connecting passage 360, and then into passages 365 and 370. Surfaces of passages 360, 365, and/or 370 may be coated with hydrophobic and/or super-hydrophobic material, and may cause the droplets in the mixture to act as described above regarding interior surfaces of manifold passage 340. The fluid mixture having droplets may exit via the exemplary apertures (e.g., apertures 380 and 385) of surface portions (e.g., surface portion 375) of the exemplary passages and may hit a user's torso. Because a user's skin or other heat source may not be strongly hydrophobic, the droplets will stick to the user. Also due to the small size of the droplets, a relatively large surface area may be covered by the spray (e.g., a relatively small amount of liquid such as water may provide a relatively large amount of spray coverage as water droplets). The airflow provided from cooling system 305 via flow assembly 310 may continuously move over a heat source such as a user's skin, or heatsink via a gap created between flow assembly 310 and the user's skin by protrusion 425 and portion 430 (e.g., protrusion 425 and portion 430 may comfortably press against the user's skin to maintain the gap between the user's skin and flow assembly 310). This airflow (e.g., mixture of air and water droplets or any other exemplary cooling fluid described above) through this gap between the heat source and flow assembly 310 leads to evaporation of the liquid (e.g., evaporation of water droplets or droplets of any other exemplary cooling fluid described above) on the skin and provides a cooling effect on the heat load (e.g., the user's body).

An exemplary operation of the exemplary disclosed system, method, and apparatus illustrated in FIGS. 11-15 will now be described. An airflow may be drawn into blower 515 (e.g., 360 degree outlet blower 515) and liquid (e.g., water or any other exemplary cooling fluid described above) may be fed to blower 515 via an injection assembly that may be similar to injection assembly 335. Based on the elastic properties of layer 645 and a configuration of portions 635 and 640, subcomponents 540, 545, and 550 may move relative to each other to allow flow assembly 510 to take a curved shape or other suitable shape to match or conform to a surface (e.g., of a heat source) being cooled.

The cooling fluid (e.g., water droplets included in airflow or any other exemplary cooling fluid described above) produced by blower 515 may flow through subcomponents 540, 545, and 550, which may have interior surfaces that are coated with a hydrophobic and/or super-hydrophobic coating that allows transport of the mixed droplet and air flow with minimal agglomeration of the droplets. Inlet portions 650 and 655 may provide restrictions to flow at inlets 605 and 615, respectively. Because passages 570 may cover a relatively greater amount of surface area at outlets 630 as described for example above, and because passage 570 may be a relatively longer channel than passages 560 and 565, passage 570 may have a higher pressure drop than passages 560 and 565. Inlet 625 of passage 570 may therefore be fully open and have substantially no restriction. Because passage 560 may cover the least surface area as described for example above and may be shorter than passages 565 and 570, passage 560 may have the lowest relative pressure drop and may accordingly have the largest restriction at inlet 605 based on inlet portion 650 (e.g., to help reduce airflow and droplet flow). As described above, a relatively uniform amount of flow to the various surfaces covered by flow assembly 510 may thereby be provided. Members 590, 595, and 600 may prevent the flow from mixing between passages 560, 565, and 570. Portions 635 and 640 may substantially prevent droplet flow from leaving a given passage in the event of flexing (e.g., downward flexing) of subcomponents 540, 545, and 550 to match a contour of a heat source as described above. For example, when subcomponents 540, 545, and 550 are bent downwards, gaps may emerge between members 575, 580, and 585 and between members 590 and 595. Portions 635 and 640 may prevent flow loss by imparting a downward direction to the flow of cooling fluid at the gaps, to avoid cooling fluid (e.g., air and water droplets or any other exemplary cooling fluid described above) from flowing through the gaps.

An exemplary operation of the exemplary disclosed system, method, and apparatus illustrated in FIG. 16 will now be described. Liquid (e.g., water or any other exemplary cooling fluid described above) may be supplied from reservoir 735 via pump 730 to injection device 720 (e.g., a spray head). Pump 725 may provide an air flow or pressurized air to injection device 720. As fan 705 operates to create an air flow, injection device 720 atomizes the liquid (e.g., water or any other exemplary cooling fluid described above) by using the air supplied by pump 725, generating a stream of fine droplets. As described for example above, these droplets may contact hydrophobic and/or super-hydrophobic interior surfaces 715 of passage 710, and may bounce off of surfaces 715 or may be rapidly removed from surfaces 715 via aerodynamic forces. In at least some exemplary embodiments, heat exchanger 740 may be non-hydrophobic and liquid droplets may accumulate on it, thereby wetting heat exchanger 740 and providing a two-phase cooling effect. Heat exchanger 740 may be warmed by a heat source (e.g., below heat exchanger 740 as illustrated for example in FIGS. 17-20) and heat is then carried away from heat exchanger 740 via convection and evaporation of the liquid droplets (e.g., water droplets or any other exemplary cooling fluid described above) on heat exchanger 740. Heat exchanger 740 may also serve to increase an available surface area for cooling. The exemplary embodiments illustrated in FIGS. 17-20 may have an exemplary operation that is similar to any of the above exemplary disclosed operations.

In at least some exemplary embodiments, the exemplary method may include providing a gaseous fluid flow in a passage (e.g., passages 340, 360, 365, 370, 560, 565, 570, 710, 1065, and/or 1170), spraying liquid droplets into the gaseous fluid flow, repelling the liquid droplets in the gaseous fluid flow from a surface of the passage, and directing the gaseous fluid flow including the liquid droplets to a heat source. Repelling the liquid droplets may include maintaining a size of the liquid droplets. The gaseous fluid flow may be an airflow. The liquid droplets may be water droplets. Repelling the liquid droplets may include causing the liquid droplets to substantially form a sphere at the surface of the passage. Repelling the liquid droplets may include substantially preventing agglomeration of the liquid droplets on the surface of the passage.

In at least some exemplary embodiments, a cooling device is disclosed that utilizes a supply of water and air or any other exemplary cooling fluid described above. The water may be turned into a spray of small droplets while being conducted by an air supply generated by a fan or other air source. The spray and airflow streams may be combined into a two-phase flow directed through hydrophobic ducts to a heat source that is to be cooled.

In at least some exemplary embodiments, a cooling device is disclosed that uses a fan or air source to move a two-phase mixture of air and water droplets through ducts having hydrophobic properties. The exemplary system may thereby minimize agglomeration (e.g., substantially prevent agglomeration) of the droplets on the walls of the ducts into larger drops based on the hydrophobic properties of the ducts, which may allow transport of the two-phase mixture over significant distances without loss of the spray (e.g., without the relatively small droplets of liquid of the spray agglomerating into larger droplets). Any suitable configuration of duct structures may be developed to provide significant flexibility in the supply and distribution of the two phase mixture. The two-phase mixture may then be supplied to an object such as a heat source to be cooled.

The exemplary disclosed system, method, and apparatus may generate relatively high levels of cooling power in hot climates while maintaining the skin of a user at a comfortable temperature. The exemplary system and apparatus may also not involve high-weight components such as compressors and thermoelectric elements, and may thereby be of a relatively low weight. The exemplary system, method, and apparatus may also use relatively little electrical power to run, and may involve relatively little battery power. The exemplary disclosed system and apparatus may also be worn underneath other layers of clothing and/or equipment of a user. For example, the exemplary disclosed system and apparatus may be worn under a bulletproof vest or other equipment and/or garments.

While multiple embodiments are disclosed, still other embodiments of the present invention will become apparent to those skilled in the art from this detailed description. The invention is capable of myriad modifications in various obvious aspects, all without departing from the spirit and scope of the present invention. Accordingly, the drawings and descriptions are to be regarded as illustrative in nature and not restrictive.

It should be noted that the features illustrated in the drawings are not necessarily drawn to scale, and features of one embodiment may be employed with other embodiments as the skilled artisan would recognize, even if not explicitly stated herein. Descriptions of well-known components and processing techniques may be omitted so as to not unnecessarily obscure the embodiments.

Many suitable methods and corresponding materials to make each of the individual parts of embodiment apparatus are known in the art. According to an embodiment of the present invention, one or more of the parts may be formed by machining, 3D printing (also known as "additive" manufacturing), CNC machined parts (also known as "subtractive" manufacturing), and injection molding, as will be apparent to a person of ordinary skill in the art. Metals, wood, thermoplastic and thermosetting polymers, resins and elastomers as described herein-above may be used. Many suitable materials are known and available and can be selected and mixed depending on desired strength and flexibility, preferred manufacturing method and particular use, as will be apparent to a person of ordinary skill in the art.

A number of implementations have been described. Nevertheless, it will be understood that various modifications may be made. For example, advantageous results may be achieved if the steps of the disclosed techniques were performed in a different sequence, or if components of the disclosed systems were combined in a different manner, or if the components were supplemented with other components. Accordingly, other implementations are contemplated within the scope of the following claims.

What is claimed is:

1. An apparatus, comprising:
   a cooling fluid passage;
   a gaseous fluid blower disposed at an upstream portion or a downstream portion of the cooling fluid passage; and
   a liquid droplet sprayer disposed at the upstream portion of the cooling fluid passage;
   wherein an interior surface portion of the cooling fluid passage is hydrophobic and/or water-repellant and has a restitution coefficient of between about 0.2 and about 0.95 when impacted with water droplets having a diameter of between 0.1 and 1 mm and traveling at a velocity of between 0.1 and 1 m/s.

2. The apparatus of claim 1, wherein a heat source is disposed at a downstream portion of the cooling fluid passage.

3. The apparatus of claim 1, wherein the surface portion of the cooling fluid passage is super-hydrophobic.

4. The apparatus of claim 1, wherein the gaseous fluid blower is an air blower.

5. The apparatus of claim 1, wherein the liquid droplet sprayer is a water droplet sprayer.

6. The apparatus of claim 1, wherein the surface portion of the cooling fluid passage has a water contact angle that is between about 150 degrees and about 179 degrees.

7. The apparatus of claim 1, further comprising a reservoir and a pump that are fluidly connected to the liquid droplet sprayer.

8. The apparatus of claim 1, wherein the interior surface portion includes a plurality of apertures having different aperture sizes.

9. The apparatus of claim 8, wherein a protrusion is disposed on the interior surface portion at a downstream adjacent location of at least some of the plurality of apertures.

10. An apparatus, comprising:
    a first cooling fluid passage;
    a gaseous fluid blower disposed at an upstream portion or a downstream portion of the first cooling fluid passage;
    a liquid droplet sprayer disposed at the upstream portion of the first cooling fluid passage; and
    a plurality of second cooling fluid passages disposed downstream of the first cooling fluid passage and fluidly connected to the first cooling fluid passage;
    wherein a super-hydrophobic coating is disposed on an interior surface of at least one of the plurality of second cooling fluid passages; and
    wherein the interior surface includes a plurality of apertures having different aperture sizes.

11. The apparatus of claim 10, wherein a protrusion is disposed on the interior surface at a downstream adjacent location of at least some of the plurality of apertures.

12. The apparatus of claim 10, wherein the plurality of second cooling fluid passages includes a plurality of overlapping passages of different lengths that have different outlet surface areas.

13. The apparatus of claim 12, wherein an inlet size is proportionally sized to an outlet surface area and a passage length for each of the plurality of overlapping passages.

14. The apparatus of claim 10, wherein the plurality of second cooling fluid passages includes a plurality of sub-components that are movable relative to each other and that are attached together by a flexible top layer.

15. The apparatus of claim 10, wherein the super-hydrophobic coating has a restitution coefficient with respect to water of between about 0.2 and about 0.95.

16. An apparatus, comprising:
    a first cooling fluid passage;
    a gaseous fluid blower disposed at an upstream portion or a downstream portion of the first cooling fluid passage;
    a liquid droplet sprayer disposed at the upstream portion of the first cooling fluid passage; and
    a second cooling fluid passage disposed downstream of the first cooling fluid passage and fluidly connected to the first cooling fluid passage;
    wherein a super-hydrophobic coating is disposed on an interior surface of the second cooling fluid passage;
    wherein the interior surface includes a plurality of apertures; and
    wherein a protrusion is disposed on the interior surface at a downstream adjacent location of at least some of the plurality of apertures.

17. The apparatus of claim 16, wherein the plurality of apertures have different aperture sizes.

\* \* \* \* \*